United States Patent [19]

Dumire

[11] Patent Number: 4,593,450
[45] Date of Patent: Jun. 10, 1986

[54] PRECISION LOCK TOOLING

[75] Inventor: Darrell L. Dumire, Sandy, Oreg.

[73] Assignee: Tektronix, Inc., Beaverton, Oreg.

[21] Appl. No.: 670,092

[22] Filed: Nov. 13, 1984

[51] Int. Cl.$^4$ .............................................. B23Q 1/06
[52] U.S. Cl. ................... 29/559; 33/181 R; 33/568; 408/72 B; 408/75; 409/218
[58] Field of Search .................. 408/1 R, 3, 25, 72 B, 408/75, 135, 241 B, 85; 51/217 R; 29/559; 409/218; 33/181 R, 568

[56] References Cited

U.S. PATENT DOCUMENTS 2,404,456 7/1946 Pierce ................................ 408/1 X
2,485,866 10/1949 Cronlund ......................... 51/217 R
2,878,576 3/1959 Cramb ............................. 33/181 X Primary Examiner—Z. R. Bilinsky
Attorney, Agent, or Firm—Robert L. Harrington

[57] ABSTRACT

A tooling plate for a circuit board drill wherein the locating apertures for the circuit board is located in the plate by the drill. A bushing cavity is provided in the tooling plate at the approximate desired position. An inner bushing having the locating aperture is laterally moveable in the cavity and an alignment pin in the drill chuck is positioned over the inner bushing at the desired location. The inner bushing is laterally adjusted to enable insertion of the alignment pin in the aperture. While being held in the desired position, a lock ring forces a clamping washer against the inner bushing to lock that position of the inner bushing member within the cavity.

7 Claims, 5 Drawing Figures

U.S. Patent   Jun. 10, 1986   4,593,450
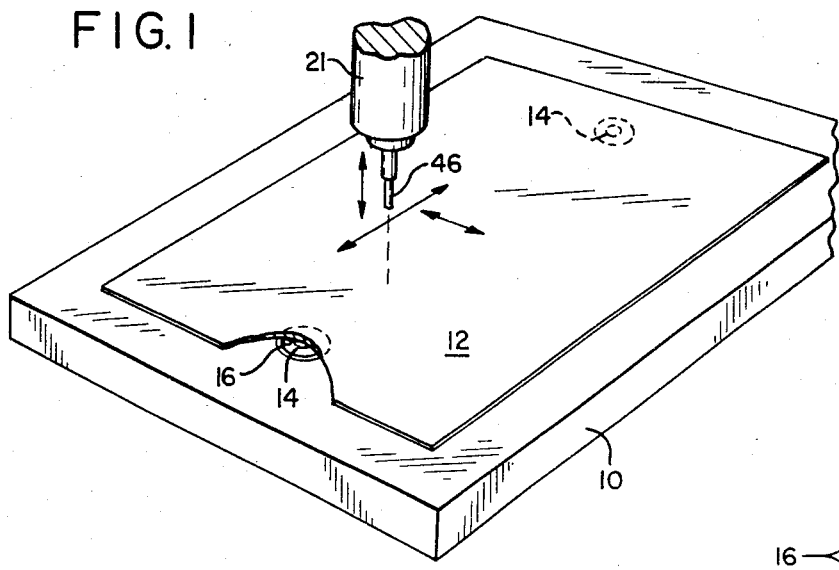
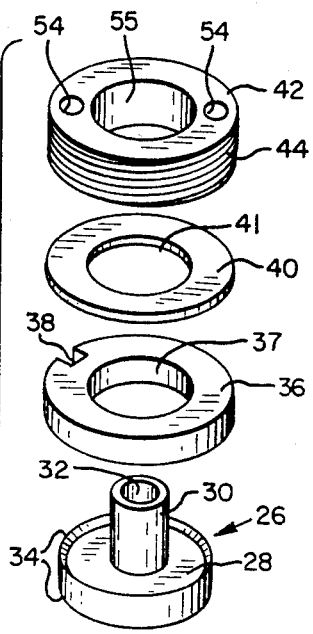
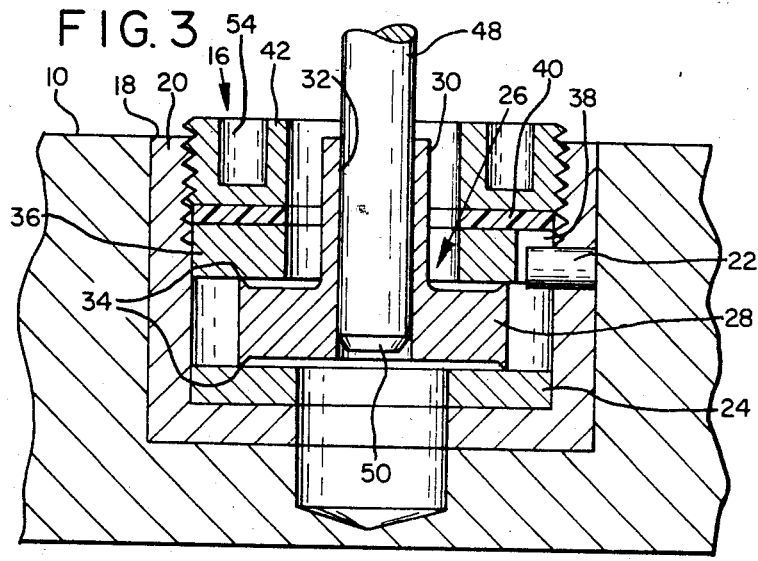
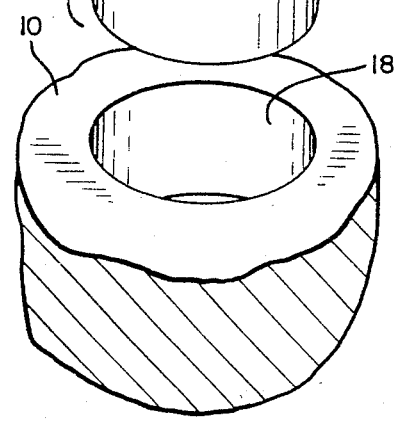
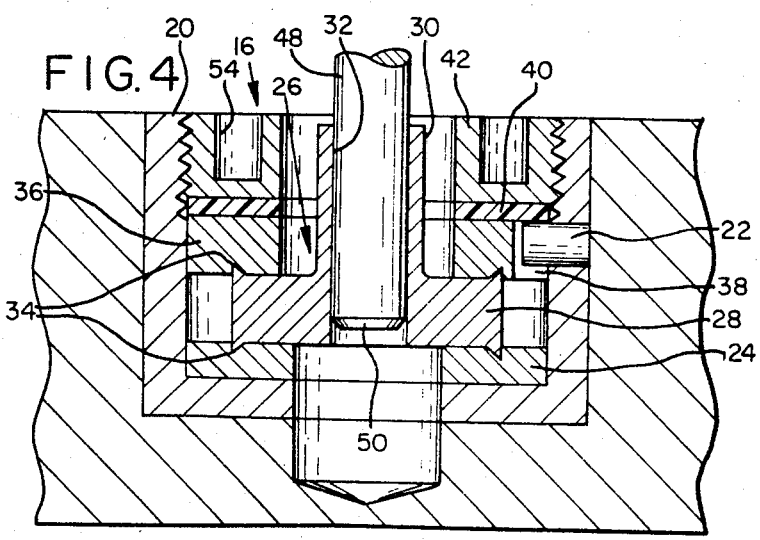
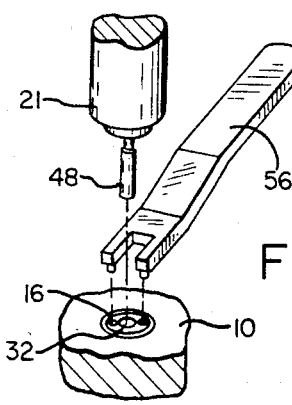

PRECISION LOCK TOOLING

FIELD OF INVENTION

This invention relates to tooling such as used for mounting a circuit board under a drill in a hole drilling operation where holes have to be drilled at precise locations in the board.

BACKGROUND OF INVENTION

A circuit board in general is a flat non-conductive board on which dozens or hundreds of minaturized electrical components are mounted. Electrical conductors are laid down in a predetermined pattern between the components and the end product is used to control the electronic function of a machine or the like.

Circuit boards are produced by the hundreds of thousands. It is quite essential that they be produced through automation and typically a series of automated operations are employeed to produce the boards. In order to coordinate these operations, it is important that the boards be produced to exactly a specified size, that the boards be mounted exactly at a designated position within each work station, e.g. in a drilling operation, that the holes (in which the components are mounted) be drilled exactly in the right place on the board and relative to each other, etc., etc. The tolerances that have to be met are measured in the thousandths of an inch and these tolerances get tighter and tighter as the circuitry demanded of the circuit boards gets more complex.

Because circuit boards are moved from one station to another, there must be a means for determining that each station uses the same reference point. Thus, it is common to equip the boards with locating pins. A pair of locating pins are precisely mounted to each board and each station includes apertures precisely located within the station wherein these pins are inserted. The equipment with proper programing can thus determine the precise location of every position on the board. The tooling plate of the numerically controlled drill (CNC drill) for one, has to be fitted with these apertures.

Heretofore the tooling plates of the CNC drill were ordered from the plate manufacturer with the locating apertures to be drilled into the plate to e.g., plus or minus 0.001 inch. The plates are very expensive to produce because of the accuracy required for locating the locating apertures. Furthermore, even when produced within the specifications, variance is generated due to temperature differences. That is, unless the CNC drill is operated at the same temperature that existed when the plates were made, the plate's thermal expansion properties will cause some distortion and offset the aperture location.

BRIEF DESCRIPTION OF INVENTION

The present invention is able to achieve far greater accuracy in establishing the locating aperture and does so while dramatically reducing the cost of producing the tooling plate. Furthermore, whereas no adjustment could be made in prior drill plates to accommodate e.g., operating temperature changes, the present invention provides means for such adjustment.

Briefly, the preferred embodiment of the invention takes advantage of the highly accurate drill hole location capabilities of the CNC drill. A bushing hole is drilled into the plate by the plate manufacturer but only loosely within the tolerances demanded for the the locating aperture. Thus, the variance permitted for the bushing hole can be within 0.030 inch (0.076 cm) as compared to a 0.001 inch (0.0025 cm) variance permitted previously.

The bushing of the present invention includes a bushing body that snuggly fits the drilled hole and includes an inner bushing that is seated in an oversized opening (as compared to the inner bushing) in the bushing body. The inner bushing can be moved about within the bushing body a distance equal to the drilling variance or greater. A lock washer sized to the bushing body opening is adapted to be locked to the inner bushing when pressed against it.

In operation a simulated located pin is mounted to the CNC drill, replacing the drill bit. The drill is then programmed with the required location of the locating aperture. With the lock washer loosely engaging the inner bushing, the drill is activated and the pin is inserted into the inner bushing moving it to the desired location in the bushing body opening. A lock ring is then screwed down into the bushing body thereby pressing the washer against the inner bushing which is then locked into position.

DETAIL DESCRIPTION AND DRAWINGS

The invention will be more clearly understood by reference to the following detailed description and drawing referred to therein, wherein;

FIG. 1 is a perspective view illustrating a CNC circuit board drill with a circuit board mounted on the drill's tooling plate;

FIG. 2 is an exploded side view of a locater bushing of the tooling plate in accordance with the present invention;

FIG. 3 is a side view of the locater bushing assembled into a tooling plate but prior to fixing the locating aperture;

FIG. 4 is similar to FIG. 3 but illustrates the locating aperture fixed in place; and FIG. 5 schematically illustrates the drill motor and tool used in fixing the locating aperture of the locater bushing.

Referring to FIG. 1 of the drawings, a tooling plate 10 is illustrated with a circuit board 12 mounted to the plate. The circuit board 12 is provided with precisely placed locating pins 14. These pins are adapted to fit locating apertures in the plate 10. The locating apertures are provided in the plate by a locater bushing 16 that is press fit into a hole drilled into the plate.

Suspended above the tooling plate is the numerically controlled drill 21. The drill is computer controlled and is adapted to drill holes in the circuit board in accordance with a predesigned program. Whereas the drill is capable of very accurately locating the holes in the circuit board, e.g. to 0.0005 inch (0.0013 cm), the ultimate accuracy is dependent on the board being precisely placed on the tooling plate 10. Thus the precise location of the locating apertures is very important. The location of the locating apertures is provided by the locator bushing 16 which will now be described.

Referring to FIGS. 2 and 3, the tooling plate 10 is provided with a hole 18 that will receive, by press fitting, the locater bushing 16. The locater bushing includes a bushing body 20 e.g., with an outside diameter of 1 inch (2.54 cm) and an inside diameter of ¾ inch (1.9 cm). The bushing body is internally threaded (threads 23) and has a pin 22 projected inwardly from its sidewall, the function of which will be later explained.

Seated on the bottom of the bushing cavity is a washer 24 of a soft metal material e.g., soft aluminum. This washer has an outside diameter that snuggly fits the inside diameter of the bushing body e.g., ¾ inch (1.9 cm). Positioned on top of washer 24 is the inner bushing 26 including a circular base 28 and spindle 30. The base 28 has an outside diameter substantially less then the inside diameter of the bushing body e.g., ⅝ inch (1.59 cm). The spindle and base are provided with a cylindrical hole 32 that is just big enough to receive pin 14 of the circuit board 12. At the periphery of base 28, at both top and bottom edges, a protruding lip or cutting edge 34 is formed, the purposes of which will be later explained.

Positioned over the base 28 and around spindle 30 is a second soft metal washer 36. This washer 36 has an outside diameter that snugly fits the inside diameter of the bushing body e.g., ¾ inch (1.9 cm). The washer has a center hole 37 that is substantially greater than the diameter of the spindle 30 so as not to interfere with lateral positioning of the inner bushing 26. A slot 38 is provided in the edge of the washer and is adapted to fit over the pin 22 as illustrated in FIG. 3. Thus the pin 22 is prepositioned in the bushing body so as to line up with washer 36 when the components are assembled. The pin 22 thereby prevents turning of the washer 36 relative to the bushing body 20.

Positioned over washer 36 is a third washer 40 that is made from a lubricant type material e.g., TEFLON. Again the center hole 41 of washer 40 is substantially greater then the spindle 30. Finally, positioned over the washer 40 is a lock ring 42. The lock ring is provided with exterior threads 44 adapted to engage the internal threads 23 of the bushing body 20. A center opening 55 again is sized to accommodate lateral movement of the spindle 30. Gripping detents 54 on the top of the lock ring are designed to accommodate a tool 56 (FIG. 5) for screwing the lock ring 42 into the bushing body 20.

OPERATION

The manner in which the locater bushing is used will now be explained. The 1 inch (2.54 cm) holes 18 are drilled into the tooling plate 10 by the tooling plate manufacturer and in accordance with the tool designer's specifications. In actuality, a single tooling plate may accommodate a number of circuit board layouts requiring a large number of holes 18 to be drilled. In this illustration, however, reference is made only to the pair of holes 18 required for positioning a single circuit board 12. The accuracy required for locating the holes in the plate permits a 0.030 inch (0.076 cm) variance. This compares to the prior practice of allowing only 0.001 inch (0.0025 cm) variance. It has been found that the cost of drilling the holes in prior plates is substantially greater than as herein prescribed due to this relaxation of specification variances.

The next step is to insert the bushing body 20 in the plate hole 18. In accordance with standard practice, the hole 18 is slightly undersized so that the bushing body 20 has to be press fit into the hole. The components as previously described are then stacked in the bushing body with the lock ring 42 loosely threaded into the bushing body as illustrated in FIG. 3. Thus, the inner bushing 26 is free to slide around as permitted by the difference in the outside diameter of the base 28 and inside diameter of the opening in the bushing body e.g., ⅝ inch (1.59 cm) vs. ¾ inch (1.9 cm) (i.e., a maximum lateral sliding movement of 0.125 inch (0.31 cm), enough to easily accommodate the 0.030 inch (0.076 cm) tolerance allowed for drilling the hole 18). Also, the lateral sliding is permitted by reason of openings 37, 41 and 55 being oversized relative to spindle 30.

With the tooling plate 10 mounted under the CNC drill 21, the drill is programmed to locate the locating aperture to be provided by aperture 32 in inner bushing 26. The normal drill bit 46 (FIG. 1) is replaced with an alignment pin 48 (FIGS. 3, 4 and 5) the end of which has a taper 50. The pin is made from hardened ground steel to resist bending and the diameter of the major portion of the pin to be inserted into the aperture 32 is exactly the same as locating pin 14.

The XY coordinate control function of the drill precisely places the alignment pin 48 over the designated position for the locating aperture. The Z cordinate function is activated to place the alignment pin just over the locater bushing 16. As required, the inner bushing 26 is manually moved to the approximate aligned position under the alignment pin 48 and the Z function is again activated to insert the alignment pin 48 into the hole 32 of the inner bushing 26. The taper 50 on the end of the alignment pin 48 produces a final adjustment of the inner bushing so that a very precise position of the hole 32 is achieved.

With the alignment pin holding the position of the inner bushing 26, a tool 56 designed to grip the gripping detents 54 is used to turn the lock ring 42 into the bushing body 20. As the lock ring is turned into the bushing body, both axial and circular or turning forces are generated. The turning force that would undesirably turn inner bushing 26 is at least partially dissipated by washer 40 which has lubricated surfaces that allows slippage between it and both the lock ring 42 and washer 36. Pin 22 which nests in slot 38 of washer 36 prevents any turning of washer 36 and thus the turning force generated by screwing of lock ring 42 is isolated from the inner bushing 26.

As axial pressure is generated by the turning of the lock ring 42, the cutting edges 34 of the inner bushing bite into the soft metal washers 24 and 36. A circular groove is thereby cut into the washers as indicated in FIG. 4 and the inner bushing 26 is thereby securely locked against further lateral movement.

Whereas from time to time it may be necessary to reregister the position of the locating aperture 32, e.g., where a temperature change is introduced to distort the tooling plate, the inner bushing can be simply repositioned. This is accomplished by disassembling the bushing, replacing the washers 24 and 36 (or inverting them if the other sides of the washers are smooth) and repeating the operation just described.

It will be appreciated that the concept of allowing the CNC drill to position the locating aperture is dependent on providing a means whereby the inner bushing has a limited degree of lateral movement during the positioning phase but can be securely locked in place when the desired position for it is established. The described embodiment accomplishes this secure positioning by providing for cutting edges on the base 28 of the inner bushing which cut into the soft metal washers 24 and 36. Variations to the structure for locking the inner bushing in place may include eliminating one of the washers, (it has been determined that one washer is sufficient in most circumstances), or providing the washer with a cutting edge that cuts into the base 28; or simply providing the engaging faces with sufficient frictional gripping properties to insure the relative fixing of the two elements when they are pressed together. Other variations will occur to those skilled in the art upon exposure to the teachings herein and accordingly, the scope of the invention is to be determined by reference to the claims appended hereto.

I claim:

1. A method of establishing a locating aperture in a circuit board drill tooling plate of a drill that comprises;

providing in a tooling plate a bushing cavity having a bottom surface and a designated lateral dimension, providing in the cavity an inner bushing having a lateral dimension less than the cavity dimension for limited free sliding movement thereof within the cavity, providing a clamping washer over the inner bushing having the same lateral dimension as the cavity, and providing locking means responsive to a vertical pressure to lock the inner bushing in place relative to the tooling plate, positioning the inner bushing at a desired location within the cavity by the insertion therein of a locating pin carried by the drill, and applying vertical pressure to the washer and thereby to the locking means to lock the position of the inner bushing within the bushing cavity.

2. A locater bushing for positioning a circuit board locating aperture in a circuit board drill tooling plate comprising; a bushing body having a central cavity with a designated inside dimension, defining cavity wall and bottom surfaces, an inner bushing confined in the cavity of the bushing body, said inner bushing having a locating aperture provided therein, said inner bushing comprised of a base having an outside dimension less than the designated inside dimension of the cavity to permit limited free lateral sliding of the inner bushing within the cavity, clamping means for directing a compressive force against the inner bushing toward the bottom surface of the cavity, and locking means responsive to said compressive force for locking the lateral position of the inner bushing within the cavity.

3. A locater bushing as defined in claim 2 wherein; the bushing body cavity defines a cylindrical cavity wall and the clamping means includes internal screw threads provided on the cylindrical cavity wall and a lock ring having exterior screw threads adapted to threadably engage the screw threads of the cavity wall to be screwed down against the base of the inner bushing.

4. A locater bushing as defined in claim 3 including; a turning force resisting washer interposed between the lock ring and base of the inner bushing, and securing means to secure the washer against turning thereof relative to the bushing body.

5. A locater bushing as defined in claim 4 wherein; the locking means is provided by the turning force resisting washer having an outside dimension corresponding to the designated inside dimension of the cavity to prevent lateral sliding of the washer in the cavity, said washer engaging the base of the inner bushing, and gripping means between the washer and base to prevent relative movement therebetween in response to the compressive force applied to the locking ring 6. A locater bushing as defined in claim 5 including; a lubricated washer interposed between the lock ring and turning force resisting washer to dissipate the effect of the turning force applied by the lock ring.

7. A locater bushing as defined in claim 6 wherein; the gripping means includes a protruding edge on the inner bushing base that cuts into the turning force resisting washer in response to the compressive force applied by the lock ring.

* * * * *